(12) United States Patent
Wang et al.

(10) Patent No.: US 6,455,938 B1
(45) Date of Patent: Sep. 24, 2002

(54) INTEGRATED CIRCUIT INTERCONNECT SHUNT LAYER

(75) Inventors: Pin-Chin Connie Wang, Menlo Park; Amit P. Marathe, Milpitas; Christy Mei-Chu Woo, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/905,479

(22) Filed: Jul. 13, 2001

(51) Int. Cl.[7] ............................................. H01L 29/45
(52) U.S. Cl. .................... 257/762; 257/768; 257/769
(58) Field of Search ................................. 257/762, 768, 257/769, 753, 295, 296, 310, 532; 438/687, 648, 656

(56) References Cited

U.S. PATENT DOCUMENTS

| | | | | |
|---|---|---|---|---|
| 5,313,089 A | * | 5/1994 | Jones, Jr. ..................... | 257/295 |
| 5,405,796 A | * | 4/1995 | Jones, Jr. ..................... | 437/47 |
| 5,576,928 A | * | 11/1996 | Summerfelt et al. ..... | 361/321.1 |
| 5,789,320 A | * | 8/1998 | Andricacos et al. ........ | 438/678 |
| 5,969,422 A | * | 10/1999 | Ting et al. .................. | 257/762 |

* cited by examiner

*Primary Examiner*—Olik Chaudhuri
*Assistant Examiner*—Laura Schillinger
(74) *Attorney, Agent, or Firm*—Mikio Ishimaru

(57) ABSTRACT

An integrated circuit and manufacturing method therefor is provided for an integrated circuit on a semiconductor substrate grated circuit having a semiconductor device. A dielectric layer is on the semiconductor substrate and has an opening provided therein. A barrier layer lines the opening, and a first conductor core fills the opening over the barrier layer. A second dielectric layer is formed on the first dielectric layer and has a second channel and via opening provided therein. A shunt layer is in the via opening above the conductor core. A barrier layer lines the second channel and via opening over the shunt layer and the second dielectric layer. A conductor core fills the second channel and via opening over the barrier layer and the first conductor core to form the second channel and via.

14 Claims, 2 Drawing Sheets

INTEGRATED CIRCUIT INTERCONNECT SHUNT LAYER

TECHNICAL FIELD

The present invention relates generally to semiconductor technology and more specifically to preventing interconnect voids in semiconductor devices.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and a "single" damascene process is completed. When the layer is processed further for placement of additional channels over it, the layer is a via stop layer.

The via formation step of the dual damascene process starts with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "capping" layer and the "dual" damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

A first major problem occurs with these barrier materials is that they are typically very high in resistance and reduce the advantage of using high conductivity materials, such as copper, which are desirable for high speed and good interconnections.

A second major problem occurs at the interface between the barrier and the conductor materials because the bonding is not very strong, and this permits atomic movement of conductor material, or electro-migration (EM), due to current flow to occur which results in void formation along the barrier layer and seed layer. This surface diffusion is particularly problematic with copper and causes these voids to occur in different locations, but most often in the vias and leads to open circuits.

A third major problem occurs with interconnects at the interconnection of the channels with the vias. Since the barrier layer is deposited over the first channel interconnect, the barrier layer prevents interconnect diffusion, especially with copper. When current flow through the interconnect causes internal electro-migration of copper from the via, the copper is not made up from the channel and this leads to voids in the via with the same negative result as with surface diffusion.

A major problem occurs with interconnects at the interconnection of the channels with the vias. When current flow through the interconnect causes internal electromigration of copper from the via, the copper is not made up from the channel because of the barrier layer which prevents electromigration between the channel and the via above it, and this leads to voids in the via which causes resistance increases and leads to integrated circuit failure over time.

If the barrier layer is eliminated between the channel and the via above it, voids form in the channel which also lead to integrated circuit failure over time.

A solution to this problem has been long sought but has long eluded those skilled in the art.

DISCLOSURE OF THE INVENTION

The present invention provides an integrated circuit having a semiconductor substrate with a semiconductor device. A dielectric layer is on the semiconductor substrate and has an opening provided therein. A barrier layer lines the opening, and a first conductor core fills the opening over the barrier layer. A second dielectric layer is formed on the first dielectric layer and has a second channel and via opening provided therein. A shunt layer is located in the bottom of the via opening above the conductor core to reduce current crowding and reduce Joule heating. A barrier layer lines the second channel and via opening over the shunt layer and the second dielectric layer. A conductor core fills the second channel and via opening over the barrier layer and the first conductor core to form the second channel and via. Even when a void forms, the current flow in the shunt layer continues to reduce current crowding and reduce Joule heating so as to increase the electromigration lifetime.

The present invention further provides a method for manufacturing an integrated circuit having a semiconductor substrate with a semiconductor device. A dielectric layer is formed on the semiconductor substrate and an opening is formed in the dielectric layer. A barrier layer is deposited to line the opening and conductor core is deposited to fill the channel opening over the barrier layer. A shunt layer is deposited in the via opening above the conductor core. A barrier layer lines the second channel and via opening except over the first channel opening. A conductor core fills the second channel and via opening over the barrier layer and the first conductor core to form the second channel and via. When a void forms, the current can flow in the shunt layer and increase the electromigration lifetime.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
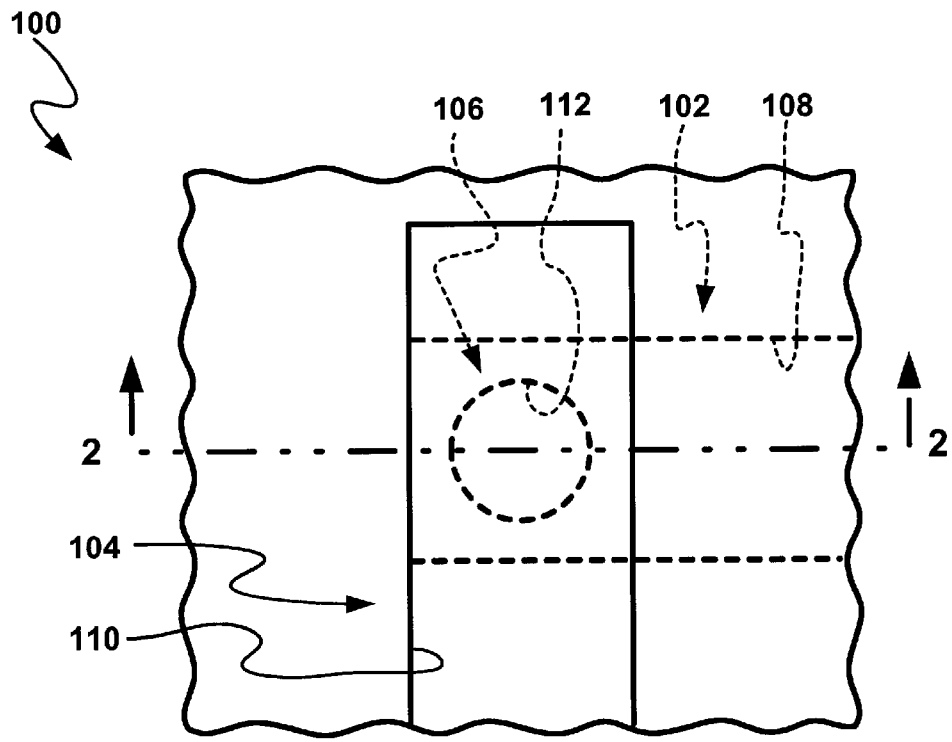
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
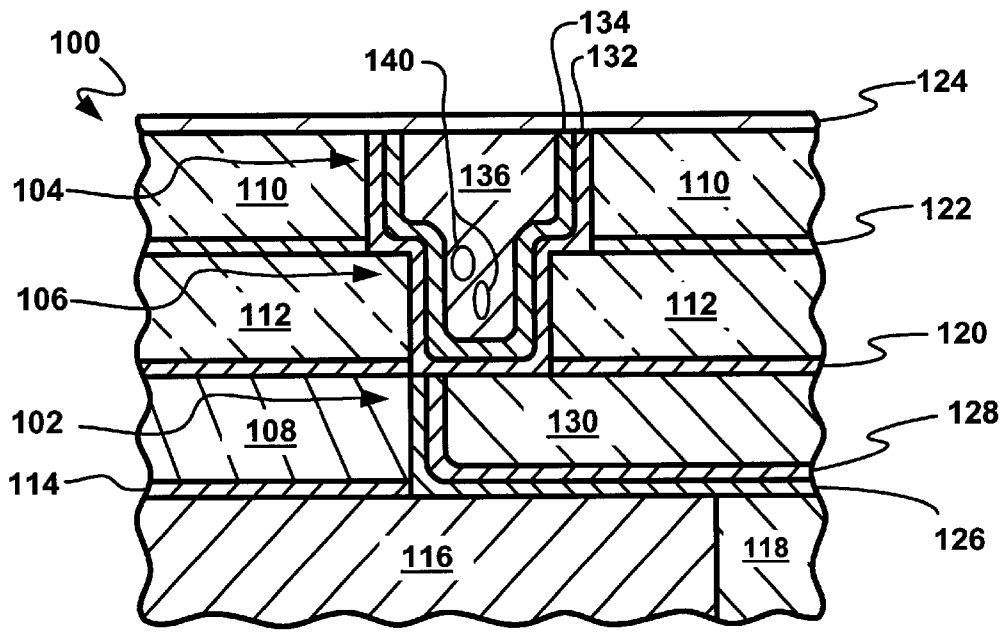
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

In the past, for copper conductor material and seed layers, highly resistive diffusion barrier materials such as tantalum nitride (TaN), titanium nitride (TiN), or tungsten nitride (WN) are used as barrier materials to prevent diffusion. In addition to increasing the overall resistance of the semiconductor chip which contained all the semiconductor devices, the barrier region 138 would block diffusion of copper from the conductor core 130 to the conductor core 136 as electromigration caused the movement of copper atoms out of the via 106 and allowed the formation of voids 140 therein.

Figure 3:
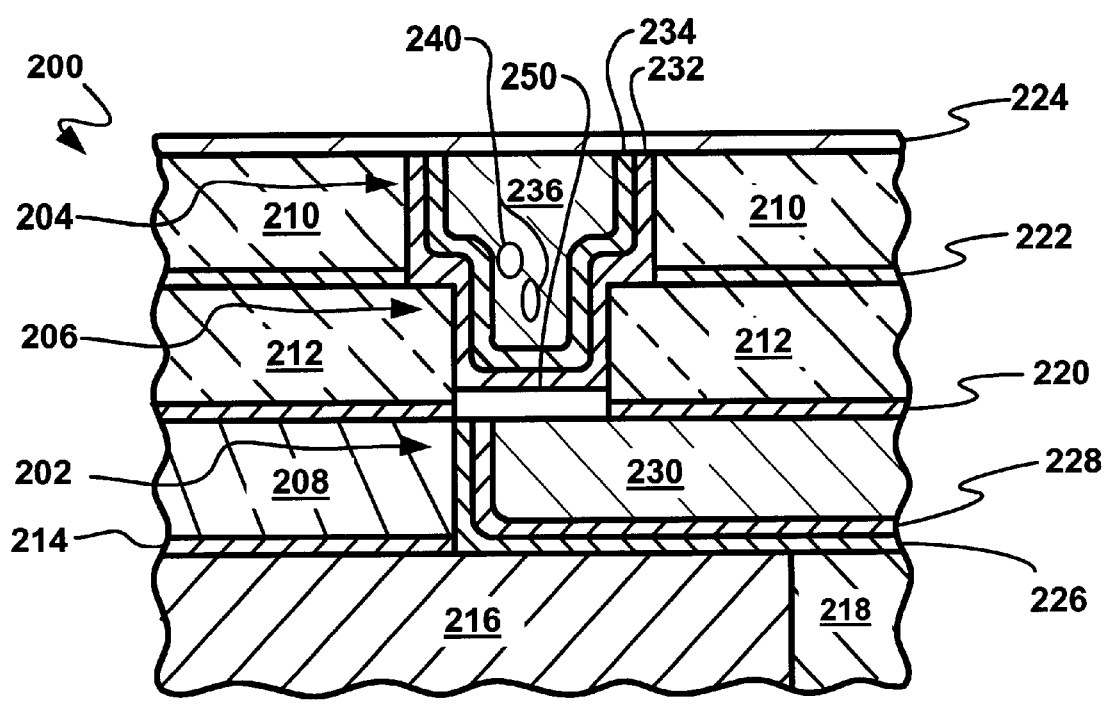
FIG. 3 is a cross-section similar to FIG. 2 (PRIOR ART) showing the conductor reservoir volume according to the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 is deposited. The seed layers 228 and 234 are of substantially the same conductor material of the conductor cores 230 and 236 and become part of the respective conductor cores 230 and 236 after the deposition.

In the present invention, a shunt layer 250 is disposed between the first channel 202 and the via 206. A shunt layer 250 is located in the bottom of the via 206 above the conductor core to reduce current crowding and reduce Joule heating. A barrier layer lines the second channel and via opening over the shunt layer and the second dielectric layer. A conductor core fills the second channel and via opening over the barrier layer and the first conductor core to form the second channel and via.

In operation, when voids 240 form, the current flow in the shunt layer 250 continues to maintain reduced current crowding and maintain reduced Joule heating so as to increase the electromigration lifetime.

In order to permit optimum current flow, the shunt layer 250 should be a material which does not mix with conductor core material, has a higher melting point than the conductor core material so the its electromigration resistance is high, and has a lower electrical resistance than the barrier layer material.

While shunt materials include barrier materials, preferred shunt materials are like ruthenium (Ru), which is deposited over the first channel 202 by long-throw, no-bias, physical vapor deposition.

In various embodiments, the barrier layers are of materials such as tantalum (Ta), titanium (Ti), tungsten (W), compounds thereof, and combinations thereof. The seed layers (where used) are of materials such as copper (Cu), gold (Au), silver (Ag), compounds thereof and combinations thereof with one or more of the above elements. The conductor cores with or without seed layers are of materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), etc. with dielectric constants below 3.9. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit comprising:
    a semiconductor substrate having a semiconductor device provided thereon;
    a first dielectric layer formed over the semiconductor substrate having a first opening provided therein including a conductor reservoir volume;
    a first barrier layer lining the first opening;
    a first conductor core filling the first opening and forming a first conductor connected to the semiconductor device;
    a second dielectric layer formed over the first dielectric layer and having a via and second opening provided therein;
    a shunt layer disposed in the via opening over the first conductor core;
    a second barrier layer lining the via and second opening over the shunt layer and the second dielectric layer; and
    a second conductor core filling the via and second opening to form a via and second conductor connected to the semiconductor device.

2. The integrated circuit as claimed in claim 1 wherein the shunt layer is a material which does not mix with the material of the first conductor core.

3. The integrated circuit as claimed in claim 1 wherein the shunt layer has a higher melting point than the first conductor core.

4. The integrated circuit as claimed in claim 1 wherein the shunt layer has a lower resistance than the barrier layer.

5. The integrated circuit as claimed in claim 1 wherein the shunt layer is of ruthenium.

6. The integrated circuit as claimed in claim 1 wherein the barrier layer and the shunt layer contain a material selected from a group consisting of tantalum, titanium, tungsten, a compound thereof, and a combination thereof.

7. The integrated circuit as claimed in claim 1 wherein the conductor core contains a material selected from a group consisting of copper, aluminum, gold, silver, a compound thereof, and a combination thereof.

8. An integrated circuit comprising:
- a semiconductor substrate having a semiconductor device provided thereon;
- a first dielectric layer formed over the semiconductor substrate having a first opening provided therein including a conductor reservoir volume;
- a first barrier layer lining the first opening;
- a first seed layer lining the first barrier layer;
- a first conductor core filling the first opening and forming a first conductor connected to the semiconductor device;
- a second dielectric layer formed over the first dielectric layer and having a via and second opening provided therein;
- a shunt layer disposed in the via opening over the first conductor core;
- a second barrier layer lining the via and second opening over the shunt layer and the second dielectric layer;
- a second seed layer lining the second barrier layer; and
- a second conductor core filling the via and second opening to form a via and second conductor connected to the semiconductor device.

9. The integrated circuit as claimed in claim 8 wherein the shunt layer is a material which does not mix with the material of the first conductor core.

10. The integrated circuit as claimed in claim 8 wherein the shunt layer has a higher melting point than the first conductor core.

11. The integrated circuit as claimed in claim 8 wherein the shunt layer has a lower resistance than the barrier layer.

12. The integrated circuit as claimed in claim 8 wherein the shunt layer is of ruthenium.

13. The integrated circuit as claimed in claim 8 wherein the barrier layer and shunt layer contain a material selected from a group consisting of ruthenium, tantalum, titanium, tungsten, a compound thereof, and a combination thereof.

14. The integrated circuit as claimed in claim 8 wherein the seed layer and the conductor core contain materials selected from a group consisting of copper, gold, silver, a compound thereof, and a combination thereof.

* * * * *